United States Patent [19]

Tsukamoto et al.

[11] Patent Number: 4,859,615
[45] Date of Patent: Aug. 22, 1989

[54] SEMICONDUCTOR MEMORY CELL CAPACITOR AND METHOD FOR MAKING THE SAME

[75] Inventors: Katsuhiro Tsukamoto; Takayuki Matsukawa, both of Itami, Japan

[73] Assignee: Mitsubishi Denki Kabushiki Kaisha, Tokyo, Japan

[21] Appl. No.: 120,694

[22] Filed: Nov. 9, 1987

Related U.S. Application Data

[63] Continuation of Ser. No. 904,843, Sep. 5, 1986, abandoned.

[30] Foreign Application Priority Data

Sep. 19, 1985 [JP] Japan .................. 60-209348

[51] Int. Cl.⁴ .................. H01L 21/265; H01L 29/96
[52] U.S. Cl. .................. 437/38; 437/47; 437/48; 357/23.6
[58] Field of Search .................. 437/52, 47, 48, 38; 357/23.6

[56] References Cited

U.S. PATENT DOCUMENTS

| | | | |
|---|---|---|---|
| 4,017,885 | 4/1977 | Kendall et al. | 156/648 |
| 4,353,086 | 10/1982 | Jaccodine et al. | 29/580 |
| 4,493,740 | 6/1985 | Icomeda | 29/580 |
| 4,523,369 | 6/1985 | Nagakubo | 29/580 |
| 4,570,325 | 2/1986 | Higuchi | 29/571 |

FOREIGN PATENT DOCUMENTS

| | | | |
|---|---|---|---|
| 0085988 | 8/1983 | European Pat. Off. | 357/23.6 |
| 0108390 | 5/1984 | European Pat. Off. | 357/23.6 |
| 0146895 | 7/1985 | European Pat. Off. | 437/67 |
| 3525418 | 1/1986 | Fed. Rep. of Germany | 357/23.6 |
| 0134443 | 8/1983 | Japan | 29/576 W |
| 0092547 | 5/1984 | Japan | 29/576 W |
| 61-56443 | 3/1986 | Japan | . |
| 0216456 | 9/1986 | Japan | 437/67 |

OTHER PUBLICATIONS

Furyama, "A Vertical Capacitor Cell for ULSI DRAM's" 1984 Symp. on ULSI Technology, Digest of Technical Papers' 10–12 Sep. 1984, San Diego pp. 16–17.

El-Kareh, "Trench Mode One-Device Memory Cell Process" IBM TDB, vol. 26, No. 9, Feb. 84. pp. 4699–4701.

Silverman, "Doped Trench Isolation Process," IBM TDB. vol. 25, No. 6 Nov. 82. pp. 3105–3106.

Wada et al., "A Folded Capacitor Cell (F.C.C.) for Future Megabit DRAM's" IEDM 1984 pp. 244–247.

Barsom "Dynamic DMOS Random-Access Memory Cell Design with Trench" IBM TDB, vol. 21, No. 7, Dec. 78 pp. 2755–2756.

Forger et al., "Improved V-Groove Technology" IBM TDB, vol. 22 No. 11 Apr. 80, p. 4886.

"Cell Structures For Future DRAM's", H. Sunami, Technical Digest of IEDM 1985, pp. 694–697.

*Primary Examiner*—Olik Chaudhuri
*Attorney, Agent, or Firm*—Lowe, Price, LeBlanc, Becker & Shur

[57] ABSTRACT

A semiconductor memory device includes a trench formed along the circumference of a planar type memory capacitor, a gate insulating film and a memory cell plate being formed on the side wall of the trench, whereby the side wall of the trench is also used as a memory capacitor.

At the bottom of the trench, a thick insulating film is formed to be a cell separating region.

9 Claims, 8 Drawing Sheets

25KV  30.5KX  328h  1360

1.0 μm

SEMICONDUCTOR MEMORY CELL CAPACITOR AND METHOD FOR MAKING THE SAME

This is a continuation of Application Ser. No. 904,843, filed Sept. 5, 1986, now abandoned.

BACKGROUND OF THE INVENTION

1. Field of the invention

The present invention relates to a semiconductor memory device, and particularly to a memory cell structure and the method of making the same which increases the electric capacity of a capacitor in a dynamic type semiconductor memory device performing storage of information by storing charges in the capacitor.

2. Description of the Prior Art

FIG. 1 illustrates a cross sectional structure of a conventional memory cell composed of one transistor/one capacitor. In FIG. 1, the memory cell comprises a memory capacitor 7 for storing charges and a transfer gate 8 for electrically connecting the capacitor 7 to a bit line.

The memory capacitor 7 comprises a semiconductor substrate 1, an extremely thin gate dielectric film 3a formed on the substrate 1, and a memory cell plate 4 formed on the dielectric film 3a. A voltage from a power supply $V_{CP}$ is applied to the memory cell plate 4 which becomes one electrode of the capacitor 7. The other electrode of the capacitor 7 is composed of the semiconductor substrate 1 (more specifically, an inversion layer formed by the cell plate 4).

The transfer gate 8 is formed of n+diffused regions 6a formed on the surface of the semiconductor substrate 1 and a gate electrode (word line) 5 formed on a charge transfer region between the n+diffused regions 6a with an extremely thin oxide film 3b interposed therebetween. One of the n+diffused regions 6a is connected to a bit line BL for reading/writing of signals. A cell isolation region 2 of thick dielectric film composed of, e.g. $SiO_2$, is formed on one end of the memory cell thereby electrically insulating the memory cell from an adjacent memory cell. The operation of the aforementioned memory cell will be hereinafter described with reference to FIG. 1.

The electric capacity C of the capacitor 7 is given by the following equation $$C = \epsilon S/t$$

where $\epsilon$ denotes the dielectric constant of the gate dielectric film 3a, t denotes the film thickness thereof and S denotes the area of the memory capacitor 7. When the voltage V from the power supply $V_{CP}$ is applied to the capacitor 7 having the capacitance value of C, the quantity of electricity Q stored in the memory capacitor 7 becomes $$Q = C \cdot V$$

The information is stored responsive to the presence or absence of the quantity of electric charge.

Reading of the information out of the memory cell is performed by applying a "H" signal to the word line WL to turn the transfer gate 8 on-state. On this occasion, the quantity of electricity Q of the capacitor 7 is transferred to the bit line BL through the transfer gate 8. When the quantity of electricity Q is transferred on the bit line BL, the presence or absence of the quantity of electricity Q is detected by a sense amplifier (not shown) connected to the bit line BL. Accordingly, the reading of the stored information is performed.

Since a conventional one transistor/one capacitor type memory cell is formed as described above, the electric capacity C of the capacitor portion must be increased in order to increase the quantity of electricity Q which can be stored in the capacitor portion. Thinning the film thickness of the gate dielectric film 3a is proposed as a method for increasing the electric capacity C, and a silicon oxide film of about 100 Å has become utilized. However a gate dielectric film with thinner film thickness lacts reliability because the number of defects such as pinholes increases, the yield thereof decreases and, in addition, the electric field strength applied to the gate dielectric film 3a extremely increases to cause a dielectric breakdown.

The electric capacity C can be increased by enlarging the area S of the capacitor. However, if the area S of the capacitor is enlarged, the occupation area of a memory cell will be increased, resulting in a big obstacle in implementation of a highly integrated memory device with a large memory capacity.

FIGS. 2A and 2B illustrate a memory cell structure (a Trench Capacitor Cell) for eliminating the above described problems in which not the occupation area of a memory cell is increased but the area of the capacitor only is increased; FIGS. 2A and 2B show the cross sectional structure and the planar layout thereof, respectively. As may be seen from FIGS. 2A and 2B, the trench capacitor cell comprises a narrow and deep trench 9 formed at the central portion of the capacitor, a thin dielectric film 3a and a memory cell plate 4 being formed in the trench 9 to form a capacitor at the inner side wall of the trench 9, whereby the effective area of the capacitor is enlarged to increase the electric capacity C.

However, in a recent semiconductor memory device with large memory capacity, since a memory cell size is minimized and the planar area occupied by the capacitor is limited, the area of the opening of the trench capacitor 9 is only about 1 to 2 $\mu m^2$. Therefore, the depth of the trench capacitor 9 need be more than 4 $\mu m$ in order to obtain the required electric capacity for the storing operation. To form such a deep trench by etching, then to form an extremely thin gate dielectric film 3a of about 100 Å and a memory cell plate 4 of polycrystalline silicon in the deep trench, and in addition, to level the surface of the capacitor portion by filling insulators in the trench is extremely difficult in the manufacturing technique resulting in a serious problem with regard to the yield.

In addition, as may be seen from the cross sectional structure shown in FIG. 2A, since trenches 9 deeper than the cell isolating region 2 are formed adjacently, the effect of isolation of the cell isolation region 2 does not work, causing a leak current flowing through the adjacent trench capacitors to erase the stored information, which is a fatal defect in a memory device.

The above described planar type capacitor and a DRAM memory cell structures having trench type capacitors are disclosed in "Cell Structure for Future DRAM'S", H. Sunami, Technical Digest of IEDM 1985, pp. 694 to 697.

SUMMARY OF THE INVENTION

An object of the present invention is to provide a semiconductor memory device and the method of making the same for eliminating the above described defects of the conventional semiconductor memory device, which is capable of increasing the electric capacity without enlarging the occupation area of the memory cell.

A semiconductor memory device according to the present invention comprises a trench formed along the circumference of a planar type memory capacitor, said trench having a thin gate dielectric film and a memory cell plate formed on the side wall thereof so that the side wall of the trench is also utilized as a memory capacitor.

Preferably, at the bottom of the trench a thick insulating film is formed to be a cell isolation region.

A method of making the semiconductor memory device according to the present invention comprises steps of forming a trench along the circumference of the planar type memory capacitor and of forming a thin gate dielectric film and the memory cell plate at the side wall of the trench.

In the semiconductor memory device according to the present invention, a trench, whose side wall is used as a memory capacitor, is formed along a relatively long circumference of a planar type memory capacitor. Therefore, the electric capacity of the memory capacitor can be increased without enlarging the occupation area thereof.

Since a thick insulating film for separating cells is formed at the bottom of the trench, no leak current flows between the adjacent trenches so that stored date will not be lost.

Accordingly, the electric capacity can be increased by enlarging the effective area of the memory capacitor without enlarging the occupation area of the memory capacitor, enabling the implementation of a semiconductor memory device having memory capacity larger than 1 megabit.

These object and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be hereinafter described with reference to the appended drawings.

Figure 3A:
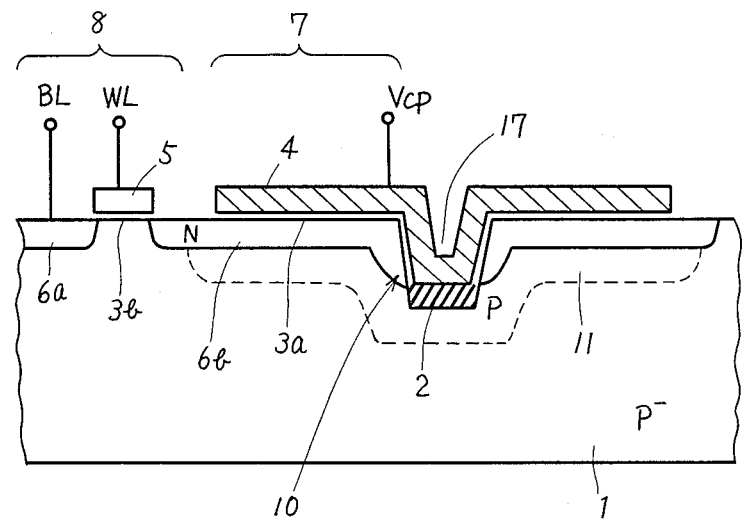
FIG. 3 illustrates the structure of a semiconductor memory device according to one embodiment of the present invention, FIGS. 3A and 3B schematically showing the cross sectional structure and a planar layout thereof, respectively.
Figure 3B:
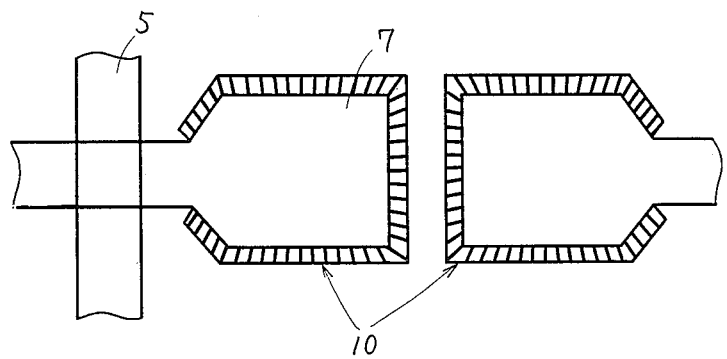

FIGS. 3A and 3B show the structure of a semiconductor memory device according to one embodiment of the present invention, FIG. 3A illustrates the cross sectional structure thereof, and FIG. 3B illustrates the planar layout thereof.

In FIG. 3A, a memory cell comprises a memory capacitor 7 and a transfer gate 8. The transfer gate 8 is composed of n+diffused regions 6a and 6b of high impurity concentration formed on the surface of the semiconductor substrate 1 and a gate electrode 5 provided on a charge transfer region between the n+diffused regions 6a and 6b with an extremely thin insulating film 3b interposed therebetween. One of the n+diffused regions 6a is connected to a bit line BL for signal reading/writing.

The memory capacitor 7 comprises a planar type capacitor portion and a circumferential capacitor 10 composed of a trench 17 formed along the circumference thereof. The planar type capacitor portion is formed of a p type impurity diffusion layer 11, an n+type impurity diffused area 10 formed thereon and a memory plate formed thereon through a thin dielectric film 3a.

The circumferential capacitor 10 is formed of a relatively shallow trench 17 formed along the circumference of the planar type capacitor portion and, a thin dielectric film 3a and the memory cell plate 4 formed on the side wall of the trench 17. A cell isolation region 2 composed of a thick insulating film is formed at the bottom of the trench 17. A p type impurity diffusion layer 11 for channel cutting is formed under the cell isolation region 2. The two impurity diffused layers formed of the n type impurity diffused layer 6b and the p type impurity diffused layer 11 form so called Hi-C structure, increasing the electric capacity of the capacitor by the junction capacitance and having the function for preventing the occurrence of a soft error due to the α particles.

Figure 1:
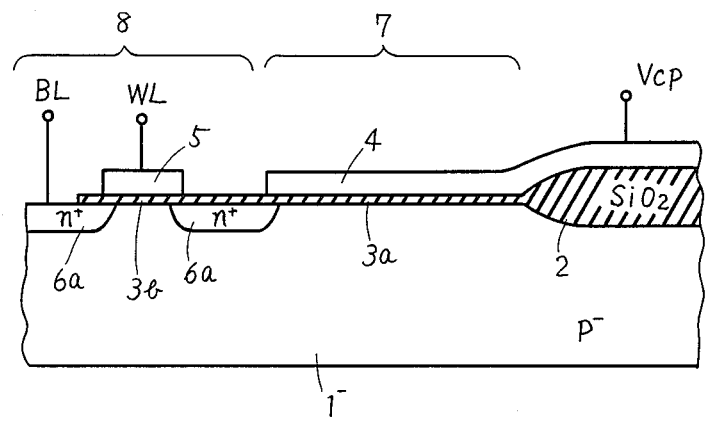
FIG. 1 is a schematic diagram showing a cross sectional structure of a conventional semiconductor memory device having a planar type memory capacitor.
Figure 2A:
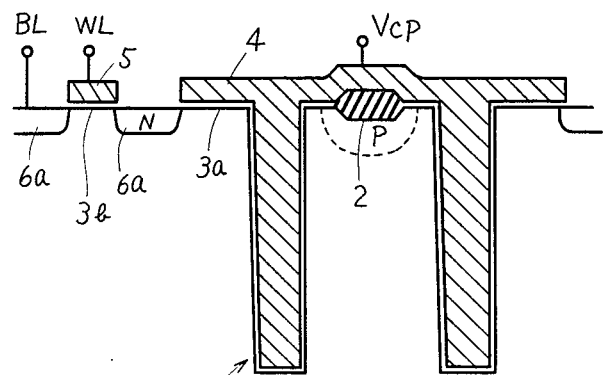
FIG. 2 shows a structure of a conventional semiconductor memory device having a trench capacitor, FIGS. 2A and 2B schematically showing the cross sectional structure and the planar layout thereof, respectively.
Figure 2B:
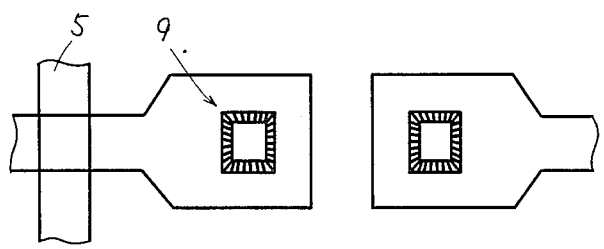

As is shown by the hatching in the planar view of FIG. 3B, a circumferential capacitor 10 utilizing the side wall of the trench 17 is formed on the circumferential portion of the planar type memory capacitor 7. Different from the trench capacitor shown in FIGS. 2A and 2B, in the circumferential capacitor 10 utilizing the circumferential portion the electric capacity remarkably increases even if the depth of the trench to be formed is less than 1 μm since the relatively long circumference of the planar type memory capacitor 7 can be utilized as the capacitor.

Figure 4:
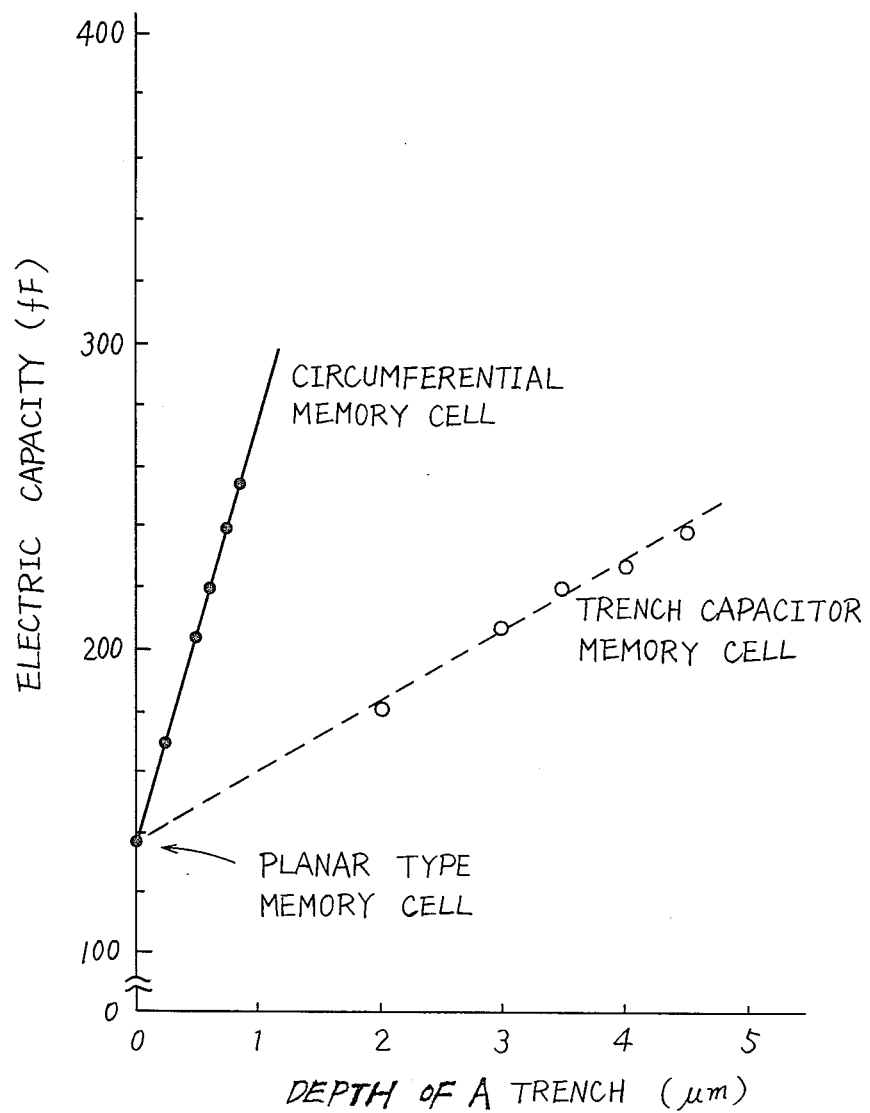
FIG. 4 is a graph showing the relation between the electric capacity and the depth of a trench comparing the memory cell having the circumferential capacitor according to the present invention with a conventional memory cell having a trench capacitor.

FIG. 4 is a graph showing the relation between the depth of the trench and the electric capacity for the memory capacitor in the conventional memory cell having a trench capacitor and the memory cell having the circumferential capacitor according to the present invention. In FIG. 4, the abscissa indicates the depth of the trench while the ordinate indicates the electric capacity. The solid line is for the memory cell having the circumferential capacitor according to the present invention, while the dotted line is for the memory cell having the conventional trench capacitor. The data shown in FIG. 4 is measured using a 1-megabit dynamic type memory device designed on a design rule of 1.2 μm. As can be seen from FIG. 4, in the memory cell having the circumferential capacitor according to the present invention, formation of a trench of 0.5 to 0.8 μm in depth accomplishes the electric capacity of 200 to 250 fF required for the stable storing operation of the memory cell. On the other hand, in the memory cell having the conventional trench capacitor, the depth of the trench is required to be 2.7 to 4.8 μm to secure the electric capacity of 200 to 250 fF, since the opening area of the trench can occupy only $1.5 \times 1.0$ μm$^2$ under the 1.2 μm design rule. Thus, the memory cell having the circumferential capacitor according to the present invention can secure the desired electric capacity merely by forming shallow trench along the circumference of the memory capacitor 7. Therefore, the memory cell of the present invention can be implemented readily without difficulty in manufacturing technique compared with the memory cell having the trench capacitor, thereby providing a structure of extremely high productivity.

The manufacturing process of the semiconductor memory device according to one embodiment of the present invention will be hereinafter described.

Figure 5A:
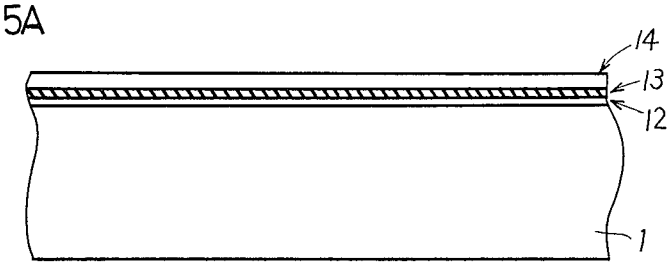
FIGS. 5A to 5Q are cross sectional views showing steps of the manufacturing method of the semiconductor memory device according to one embodiment of the present invention.
Figure 5B:
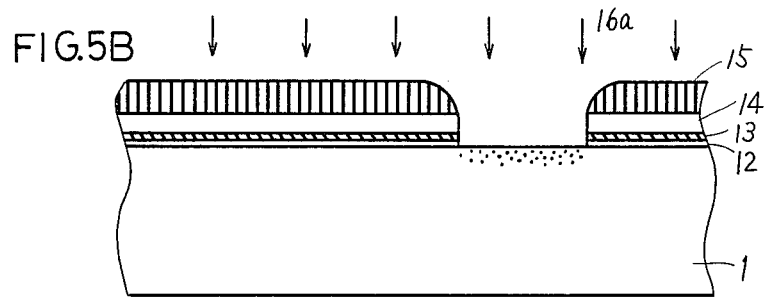
Figure 5C:
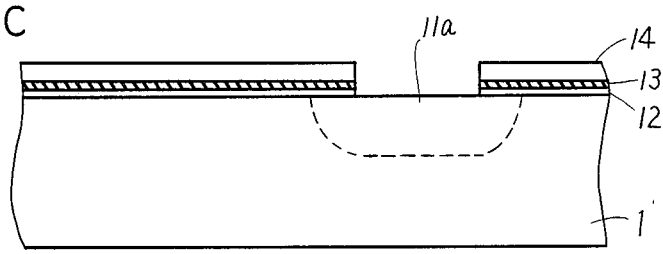
Figure 5D:
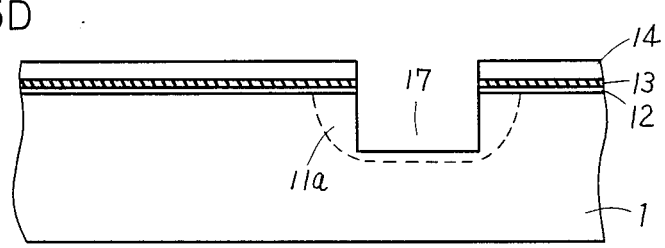
Figure 5E:
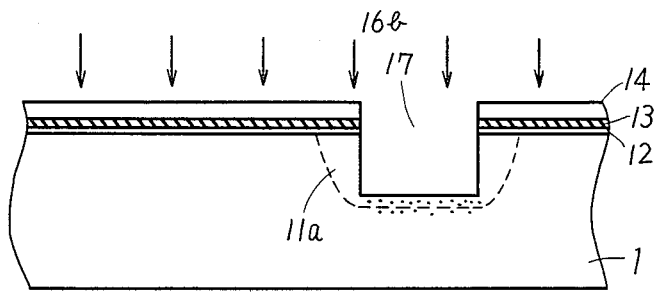
Figure 5F:
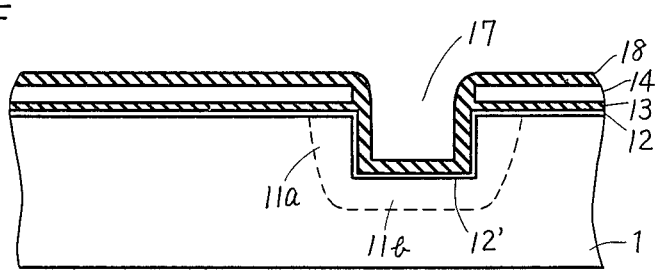
Figure 5G:
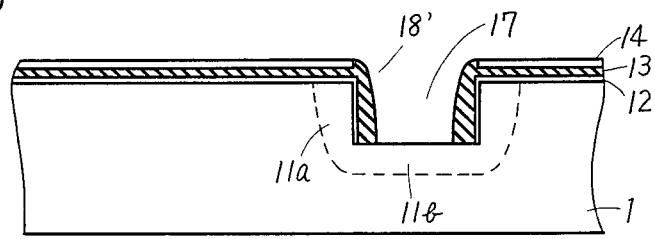
Figure 5H:
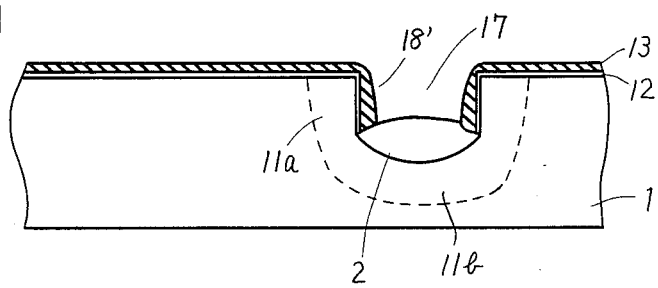
Figure 5I:
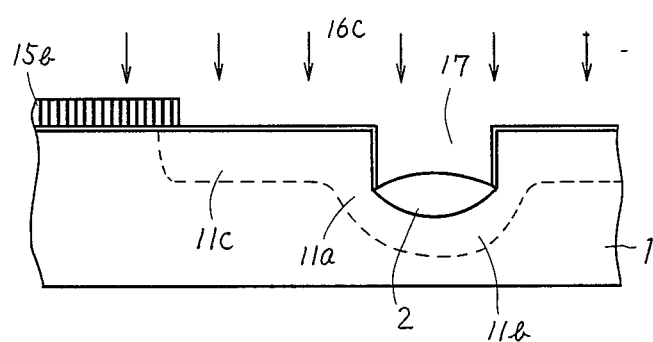
Figure 5J:
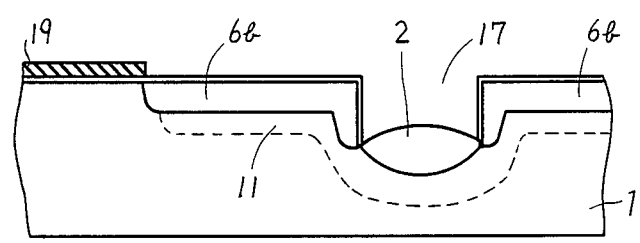
Figure 5K:
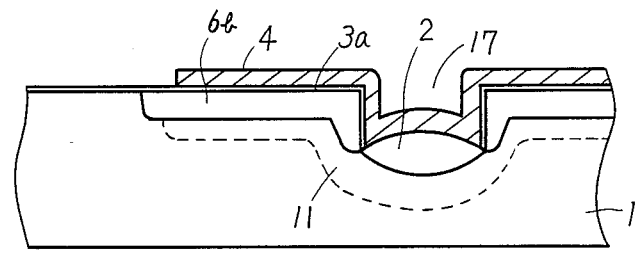
Figure 5L:
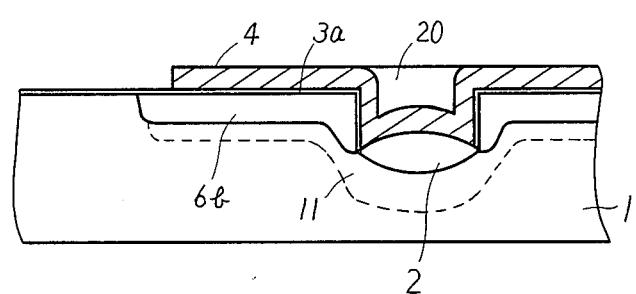
Figure 5M:
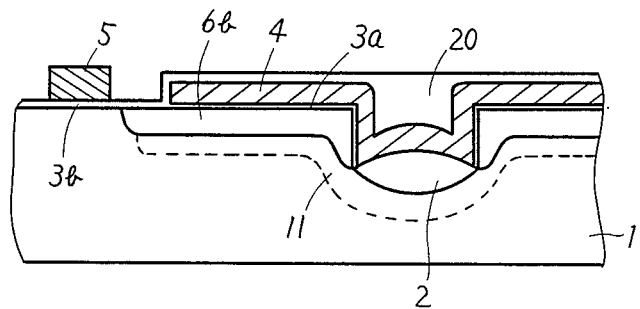
Figure 5N:
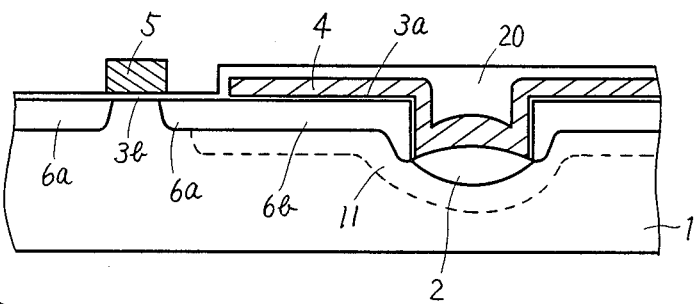
Figure 5O:
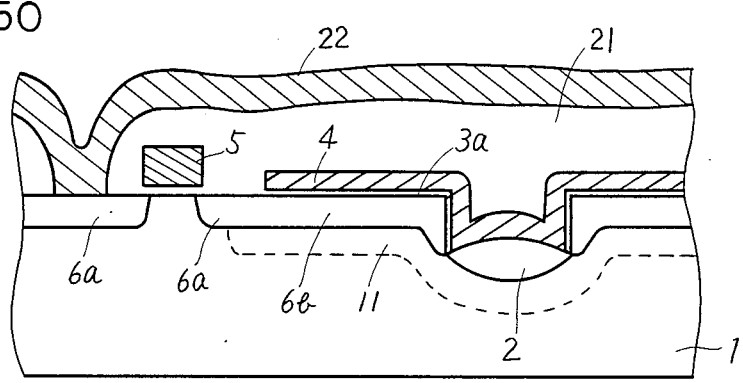

FIGS. 5A to 5O are cross sectional views showing steps of the manufacturing process of the semiconductor memory device according to one embodiment of the present invention.

First, as shown if FIG. 5A, a silicon oxide film 12, silicon nitride film 13 and a silicon oxide film 14 are formed in this order on the surface of a semiconductor substrate 1 of a first conductivity type, in this embodiment p$^-$ type.

Then, as shown in FIG. 5B, a resist pattern 15 defining the cell isolation region 2 is formed using photolithography technique. A region of a composite film composed of the silicon oxide film 12, silicon nitride film 13 and silicon oxide film 14 corresponding to the cell isolation region 2 is removed by etching using the resist pattern 15 as a mask. Then, ions of an impurity such as boron are implanted in the surface of the semiconductor substrate 1 (16a) using the resist pattern 15 as a mask.

Subsequently, as shown in FIG. 5C, the resist pattern 15 is removed, and then the ion-implanted boron is diffused by thermal processing in a high temperature to form a p$^+$ type region 11a with high impurity concentration.

Then, as shown in FIG. 5D, the semiconductor substrate 1 is etched to the depth of 0.5 to 0.8 μm using the composite film of the silicon oxide film 12, 14 and the silicon nitride film 13 as a mask to form a trench 17 in the cell isolation region. On this occasion, the p$^+$ type region 11a formed in the preceding process (FIG. 5C) spreads in the horizontal direction to some extent due to the thermal processing, so that the side wall of the trench 17 becomes p$^+$ region.

After the formation of the trench 17, as shown in FIG. 5E, implantation (16b) of an impurity, e.g., boron, in the bottom of the trench 17 is performed using the composite films 12 13 and 14 mask to form the p$^+$ type region 11b at the bottom surface of the trench 17.

Then, as shown in FIG. 5F, the surface of the trench 17 is oxidized thin to grow a silicon oxide film 12', and thereafter a silicon nitride film 18 is deposited on the entire surface of the semiconductor substrate 1 by using, e.g., reduced pressure CVD method. Since the silicon nitride film deposited by the reduced pressure CVD method provides an extremely good step coverage, a silicon nitride film of the same film thickness as that of the flat portion can be deposited on the side wall of the trench 17.

Subsequently, as shown in FIG. 5G, the silicon nitride film 18 is etched by using, e.g., reactive ion etching technique. The reactive ion etching method is so called an anisotropic etching having strong directivity of etching, so that the silicon nitride at the flat portion is removed by the etching, while the silicon nitride film 18' deposited on the side wall of the trench 17 can be left. Thus, a frame 18' of the silicon nitride film can be formed on the side wall of the trench 17. In addition, since the silicon nitride film 13 is formed on the surface of the semiconductor substrate except the trench 17, a structure is implemented such that the semiconductor substrate of silicon is exposed only at the bottom of the trench 17.

Then, as shown in FIG. 5H, only the bottom portion of the trench 17 which is not covered by the silicon nitride film is thermally oxidized in an oxidizing atmosphere at a high temperature to grow a thick silicon oxide film (field oxide film) 2 for cell isolation.

The silicon nitride films 13 and 18' used as a mask for selective oxidation is removed by using hot phosphoric acid or the like. In this state, an cell isolation region composed of a thick dielectric film, in the present embodiment a silicon oxide film, and a p$^+$ type region 11b serving as a channel cutting layer below is formed at the bottom of the trench 17 and, a p$^+$ type region 11a is formed on the side wall of the trench 17. Through the aforementioned steps, the process for forming the cell isolation region is completed followed by the process for forming so called Hi-C structure which helps to increase the electric capacity of the memory capacitor and to decrease soft errors caused by α rays radiated from package material etc. The Hi-C structure has a P/N junction formed below the capacitor to increase the capacity of the capacitor by means of the junction capacitance of the P/N junction.

First, as shown in FIG. 5I, a resist pattern 15b defining the Hi-C region is formed by the photolithography and then ion implantation 16c of an impurity such as boron is performed using the resist pattern 15b as a mask. After the removal of the resist 15b, a p$^+$ type region 11c is formed by annealing process.

Figure 6:
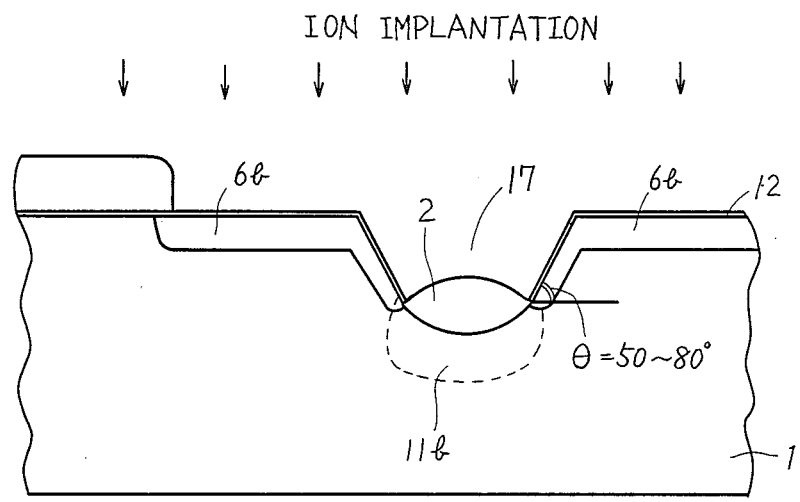
FIG. 6 is a cross sectional view in a step of manufacturing a semiconductor memory device according to another embodiment of the present invention.

Next, as shown in FIG. 5j, an n$^+$ type region 6b of high impurity concentration is formed. The n$^+$ type region 6b needs to be formed in such a manner that it contacts with the entire area of the side wall of the trench 17. Since when the sides of the trench 17 are perpendicular to the bottom, the ion implantation through the side wall of the trench 17 cannot be performed. Then, the n$^+$ type region 6b is formed by diffusing phosphorous or arsenic etc. using thermal diffusion method. While, as shown in FIG. 6, if the sides of the trench are etched such that the angle of inclination is controlled to be 50° to 80°, the n$^+$ type region 6b can be formed by implanting ions from the side wall of the trench 17 using the ion implantation method. If the angle of inclination of the trench 17 is from 50° to 80°, the ion implantation 16a of boron for forming the p$^+$ type region on the side wall of the trench 17 as performed in FIG. 5B can serve as the step of FIG. 5I.

Then, as shown in FIG. 5K, the process proceeds to the step of forming the memory capacitor. First, a thin silicon oxide film 3a of about 100 Å is formed as a dielectric film on the surface of the semiconductor substrate 1 and, a capacitor electrode (memory cell plate) 4 composed of an n type polycrystalline silicon is formed thereon. The higher the dielectric constant ε of the insulating film 3a is, and the thinner the film thickness thereof is the more, the electric capacity of the capacitor increases. Therefore it is preferred that the silicon oxide film 3a is as thin as possible. In some cases, a composite film of silicon nitride film and silicon oxide film is used in order to increase the dielectric constant ε. In either case, a capacitor having large electric capacity can be implemented as described above since a memory capacitor is also formed on the side wall of the trench 17.

There are steps of about 0.5 to 0.8 μm generated at the trench 17. In order to prevent these steps from causing inconvenience in the following steps, the trench 17 is fulfilled with an insulator 20 and made flat as shown in FIG. 5L. This insulator 20 also prevents the formation of a parasitic MOS transistor on the side wall of the trench 17. The trench 17 is made flat by depositing, e.g., the silicon oxide film to the thickness equal to the depth of the trench on the surface of the semiconductor substrate by CVD method and by spin-coating a thick resist thereon. In this manner, the surface of the resist is made almost completely flat regardless of the unevenness of the surface of the semiconductor substrate. Then, by etching the resist and the silicon oxide at the same rate (etch back method) the insulator 20 is filled within the trench 17 only and at the same time the surface thereof is made flat.

In FIG. 5N, in order to form a transfer gate region, a gate dielectric film 3b is grown after the ion implantation for controlling the threshold voltage $V_{th}$ of the MOS transistor. Then a gate electrode 5 composed of polycrystalline silicon and refractory metal silicide or refractory metal, or a composite film thereof is formed on a prescribed region on the gate dielectric film 3b to form the structure shown in FIG. 5M.

In FIG. 5N, the ion implantation of an impurity such as arsenic is carried out to form the source and the drain regions 6a.

As shown in FIG. 5O, after the formation of an interlayer insulating film 21, a contact hole is formed at a predetermined region and an aluminum interconnection layer (in the figure bit line) 22 is formed, and thus the manufacturing process of the semiconductor memory device is completed.

The manufacturing method of the semiconductor memory device according to one embodiment of the present invention is described as above.

Figure 7:
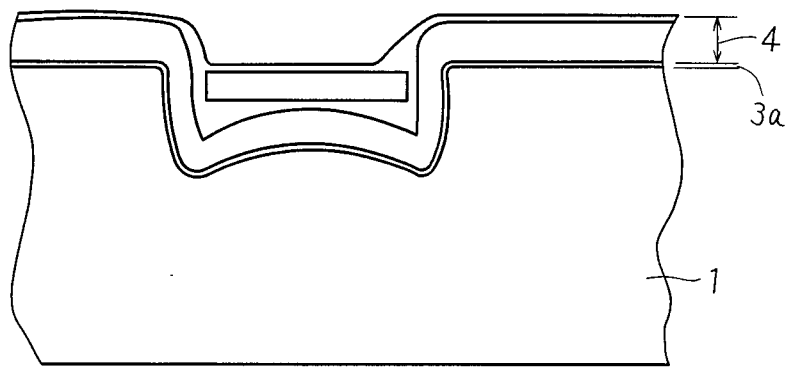
FIG. 7 is an illustration of an electro microphotograph specifically showing the structure of a memory cell having the circumferential capacitor obtained by one embodiment of the present invention.

FIG. 7 shows an illustration of an electro microphotograph showing the specific cross sectional structure at the completion of the formation of the memory capacitor (FIG. 5K); As may be seen from FIG. 7, a silicon oxide film 2 for cell isolation is formed at the bottom of a trench having the depth of about 0.6 μm and, a thin dielectric film 3a and an electrode (memory cell plate) 4 are formed on the side wall of the trench 17 continuously from the flat portion, enabling the structure which can utilize the side wall of the trench 17 as a capacitor.

Although in the above embodiment, description is made on an n channel type memory cell using an electron as a carrier, a p channel type memory cell using a hole as a carrier may obtain the same effect as the above described embodiment by inverting the conductivity type of the impurity.

As described above, the semiconductor memory device according to the present invention provides a relatively shallow trench formed along the circumference of a planar type memory capacitor, a thin insulating film and an electrode being formed on the side wall of the trench continuously from the flat portion and an element separating region composed of a thick insulating film being formed at the bottom of the trench, thereby enabling the side wall of the trench to be utilized as a memory capacitor. Accordingly, the present invention can increase the electric capacity of the memory cell without increasing the occupation area of the memory cell, and in addition, it does not employ complicated manufacturing process, so that a semiconductor memory device of larger capacity more than 1 megabit can be manufactured with high yield and low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device comprising memory cells arrayed on a common semiconductor substrate of a particular conductivity type, each cell having a capacitance region for storing an electric charge, comprising the steps of:
    forming in the substrate a heavily doped region of the particular conductivity type;
    etching into the substrate a circumferential trench that circumscribes a major portion of said capacitance region of said cell, with said heavily doped region underlying and surrounding said trench;
    forming on the substrate a thin dielectric film;
    forming on said dielectric film a conductive film to provide a capacitor having a planar portion on a planar region of said substrate and an edge portion on a sidewall of said trench, said planar portion of said capacitor extending outward from said trench and, together with said edge portion, establishing said capacitance region of one said cell; and
    depositing an insulating layer within said trench, beneath said capacitor, to establish isolation from an adjacent cell.

2. A method for manufacturing a semiconductor memory device according to claim 1, wherein said step of forming said thin dielectric film comprises the steps of
    forming an oxidation-resistant silicon nitride film on the side wall of said trench and on the surface of said capacitance region; and
    performing selective thermal oxidation at a bottom of the trench using said silicon nitride film as a mask.

3. A method for manufacturing a semiconductor memory device according to claim 2, wherein said step of forming the silicon nitride film to be said mask comprises the steps of
    forming a silicon nitride film on the entire exposed surface of said semiconductor substrate after forming said trench by etching; and
    leaving said silicon nitride film only on the side wall of said trench by anisotropically etching said formed silicon nitride film.

4. A method for manufacturing a semiconductor memory device according to claim 3, further comprising the step of performing ion implantation of an impurity only at the bottom of said trench prior to the step of forming a thin insulating film at the bottom of said trench,
   whereby a channel cutting layer is formed at the same time of forming said thin dielectric film.

5. A method for manufacturing a semiconductor memory device according to claim 4, wherein said impurity for said ion implantation is boron.

6. A method of manufacturing a semiconductor memory device according to claim 1, further comprising the step of planarizing the surface of the semiconductor substrate by filling an insulator in said trench after the step of forming the electrode layer on the side wall of said formed trench.

7. A method for manufacturing a semiconductor memory device according to claim 1, wherein the angle of inclination of said side wall of said trench is approximately 90°.

8. A method for manufacturing a semiconductor memory device according to claim 1, wherein the angle of inclination of the side wall of said trench is 50° to 80°.

9. A method for manufacturing a semiconductor memory device according to claim 1, wherein the step of forming said heavily doped region comprises the steps of depositing a photoresist pattern on said substrate, ion implanting a first layer of a heavily doped impurity having a first conductivity type into said substrate in a region defined by said photoresist pattern, and forming in said substrate a second layer of a heavily doped impurity having a second conductivity type overlying the first layer and in contact with the side wall of the circumferential trench.

* * * * *